(12) United States Patent
Voutsas (10) Patent No.: US 7,153,730 B2
(45) Date of Patent: Dec. 26, 2006

(54) PULSE WIDTH METHOD FOR CONTROLLING LATERAL GROWTH IN CRYSTALLIZED SILICON FILMS

(75) Inventor: Apostolos Voutsas, Vancouver, WA (US)

(73) Assignee: Sharp Laboratories of America, Inc, Camas, WA (US)

( * ) Notice: Subject to any disclaimer, the term of this patent is extended or adjusted under 35 U.S.C. 154(b) by 737 days.

(21) Appl. No.: 10/384,888

(22) Filed: Mar. 10, 2003

(65) Prior Publication Data

US 2003/0166309 A1   Sep. 4, 2003

(51) Int. Cl.
 *H01L 21/00*   (2006.01)
(52) U.S. Cl. .................. 438/149; 438/166; 438/486; 257/E31.041
(58) Field of Classification Search ............. 438/166, 438/795, 486
See application file for complete search history.

(56) References Cited

U.S. PATENT DOCUMENTS 6,746,903 B1 *   6/2004   Miyasaka ................. 438/149

* cited by examiner

*Primary Examiner*—Michael Lebentritt
*Assistant Examiner*—Elias M Ullah
(74) *Attorney, Agent, or Firm*—Law Office of Gerald Maliszewski; Gerald Maliszewski

(57) ABSTRACT

A method is provided for crystallizing a silicon film in liquid crystal display (LCD) fabrication. The method comprises: forming an amorphous silicon film having a thickness in the range of 100 to 1000 Angstroms (Å); irradiating the silicon film with a laser pulse having a pulse width of 50 nanoseconds (ns) or greater, as measured at the full-width-half-maximum (FWHM), using a beamlet width in the range of 3 to 20 microns; and, in response to irradiating the silicon film, laterally growing crystal grains. In one example, irradiating the silicon film may include irradiating with a pulse having a pulse width in the range between 30 and 300 ns FWHM, and an energy density in the range from 200 to 1300 millijoules per square centimeter (mJ/cm$^2$).

42 Claims, 5 Drawing Sheets

PULSE WIDTH METHOD FOR CONTROLLING LATERAL GROWTH IN CRYSTALLIZED SILICON FILMS

BACKGROUND OF THE INVENTION

1. Field of the Invention

This invention generally relates to liquid crystal display (LCD) and integrated circuit (IC) fabrication and, more particularly, to a silicon film and fabrication process to laser irradiate silicon film in making polycrystalline silicon thin film transistors (TFTs) for Active Matrix (AM) LCDs.

2. Description of the Related Art

Lateral crystallization by excimer-laser anneal (LC-ELA) is a desirable method for forming high quality polycrystalline silicon films having large and uniform grains. Further, this process permits precise control of the grain boundary locations.

Figure 1:
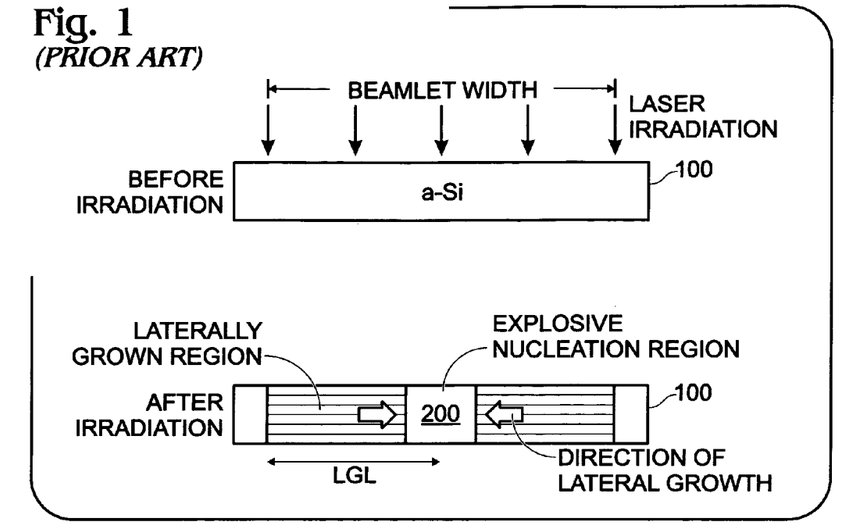
FIG. 1 is partial cross-sectional view illustrating the topography of laser-irradiated domains (prior art).

FIG. 1 is partial cross-sectional view illustrating the topography of laser-irradiated domains (prior art). After the completion of lateral growth, the two crystal fronts meet at the center of the domain 200 where explosive nucleation occurs. The stepping distance of the beam is a crucial factor in the process throughput and, hence, the economics of the LC-ELA process in mass productions. The stepping distance, in turn, is dependent upon the lateral growth length (LGL). LGL is affected by the transient temperature profile of the film, which defines the time for the lateral propagation of the two facing crystal fronts, before the remaining molten volume becomes cold enough to trigger copious (explosive) nucleation.

It would be desirable to improve the lateral growth length (LGL) during crystallization. Such improvement would enable an increase of the stepping distance between successive shots.

It would be advantageous if the melt duration of the laser-irradiated volume of silicon film could be increased, to gain a corresponding increase in the LGL.

SUMMARY OF THE INVENTION

The present invention is a method that prolongs the melt duration during the laser irradiation of the silicon film, thereby increasing the lateral growth length (LGL). The increase in the melt duration is achieved by controlled manipulation of the pulse duration of the laser irradiation.

Accordingly, a method is provided for crystallizing a silicon film in LCD fabrication. In one aspect, the method comprises: forming an amorphous silicon film having a thickness in the range of 100 to 1000Angstroms (Å); irradiating the silicon film with a laser pulse having a pulse width of 50 nanoseconds (ns) or greater, as measured at the full-width-half-maximum (FWHM), using a beamlet width in the range of 3 to 20 microns; and, in response to irradiating the silicon film, laterally growing crystal grains. In one example, irradiating the silicon film with a laser pulse having a pulse width of 50 ns or greater includes irradiating with a pulse having a pulse width in the range between 30 and 300 ns FWHM, and an energy density in the range from 200 to 1300 millijoules per square centimeter (mJ/cm$^2$).

Details of specific film thicknesses, pulse width, beamlet widths, and energy levels are provided below, along with alternate aspects of the present invention pulse width crystallization method.

DETAILED DESCRIPTION OF THE PREFERRED EMBODIMENTS

Figure 2A:
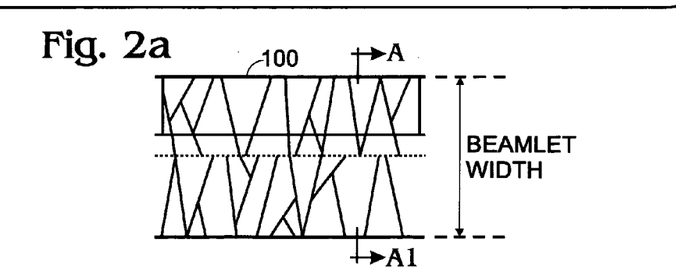
FIGS. 2a through 2d illustrate steps in the present invention LC-ELA annealing process.
Figure 2B:
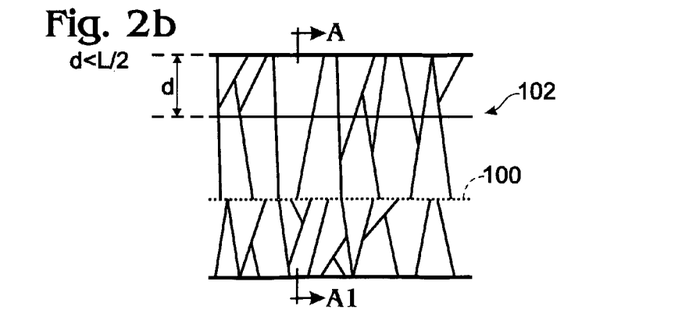
Figure 2C:
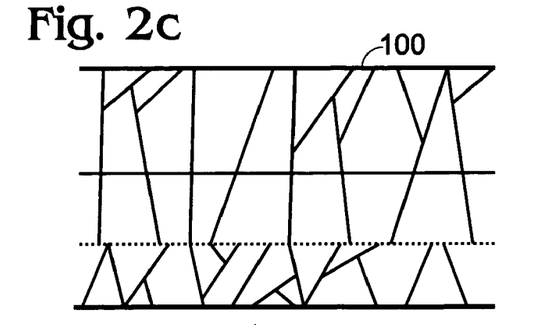
Figure 2D:
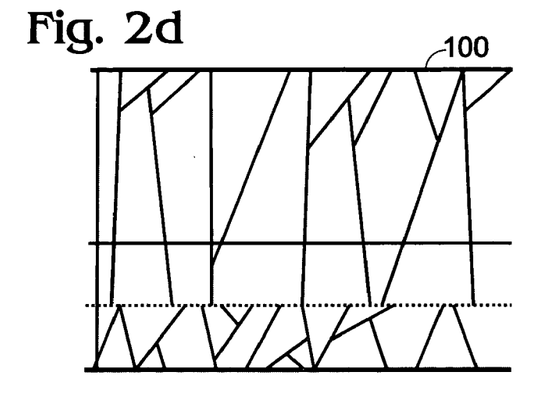

FIGS. 2a through 2d illustrate steps in an LC-ELA annealing process. As seen in FIG. 2a, initially amorphous silicon film 100 is irradiated by a laser beam that is shaped by an appropriate mask to an array of narrow "beamlets". The shape of the beamlets can vary. In FIGS. 2a–2d, each beamlet is shaped as a straight slit of narrow width, approximately 3–20 microns (μm). In some aspects, the beamlet width is in the range of 3–10 microns, while in others, the beamlet width is in the range of 3–5 microns. This slit is represented in the figures as the two heavy lines. The width of the slit is the distance between these two lines. This width can vary, but ultimately it is dependent upon the attainable lateral growth length (LGL), which is defined as the distance crystals can grow laterally (inwardly) from the edges of the irradiated area. Typically, the beamlet width is designed to be slightly less than twice the corresponding LGL.

The sequence of FIGS. 2a–2d illustrates the growth of long polysilicon grains by LC-ELA process. A step-and-repeat approach is used. The laser beamlet width (indicated by the 2 parallel, heavy black lines) irradiates the film and, then steps a distance (d), to point 102, smaller than half of the lateral growth length (L), i.e. d<L/2. Using this step-and-repeat process, it is possible to continually grow crystal grains from the point of the initial irradiation, to the point where the irradiation steps cease.

Figure 3:
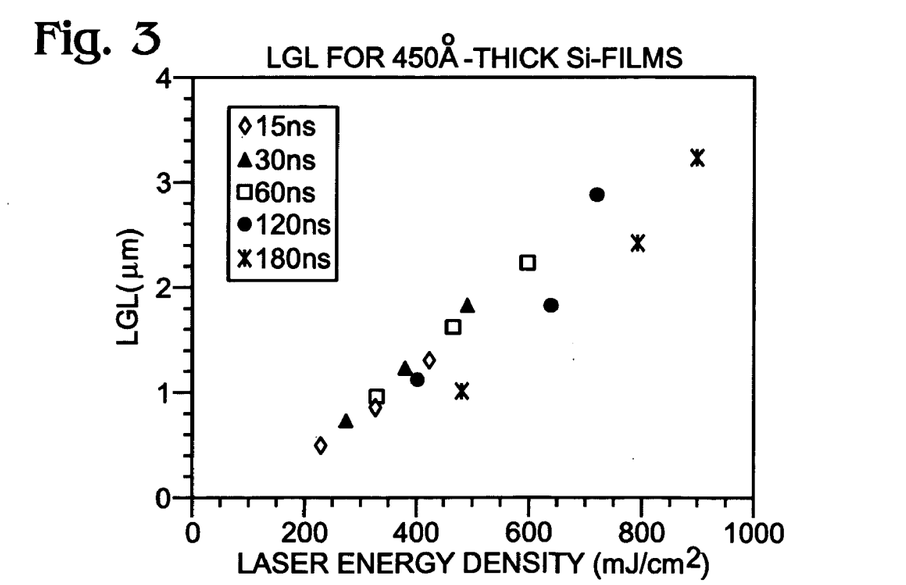
FIG. 3 is a graph illustrating a plot of LGL as a function of silicon film thickness, laser energy density, and laser pulse duration.

FIG. 3 is a graph illustrating a plot of LGL as a function of silicon film thickness, laser energy density, and laser pulse duration. As shown, LGL increases with the applied energy density. However, the energy density cannot be increased indefinitely, as silicon film evaporates in response to exposure to high laser energy density values. The range of pulse durations, for a film thickness of 450 Å, represents the boundaries within which the energy density can reasonably be varied. Outside these ranges the film either does not completely melt (below the minimum point) or evaporates (above the maximum point). Note, the pulse widths and energy density values vary in response to the film thickness. A thickness of 450 Å is provided as an example of pulse duration and energy density values.

One method of increasing the LGL involves increasing pulse durations. As shown in FIG. 3, an increase in pulse duration from approximately 30 ns (nominal) to approximately 180 ns can drastically increase the LGL. This LGL increase is more substantial for thicker films. Nonetheless, even for thinner films with thicknesses of less than 45 nanometers (nm), a LGL of greater than 3 microns can be reasonably expected.

It should be noted that pulse durations of greater than 180 ns can be achieved using existing technology. Commercial excimer lasers currently exist, such as the XeCl excimer laser made by the French company SOPRA, S.A., capable of delivering pulses of up to approximately 240 ns in duration Full-Width-Half-Maximum (FWHM). Hence, the experimental results depicted in FIG. 3, are achievable in mass production LCD fabrication.

Figure 4A:
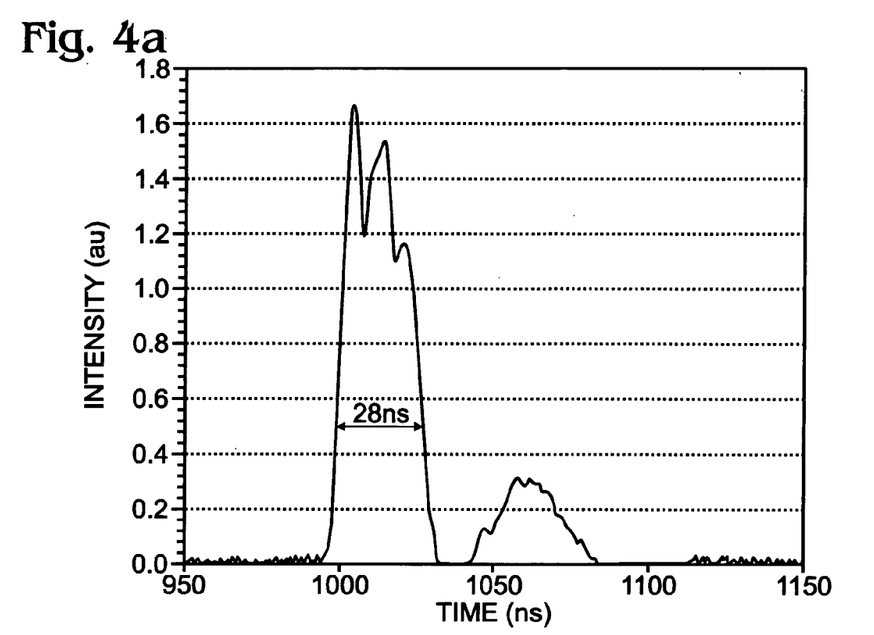
FIGS. 4a and 4b illustrate pulse width durations applicable to the present invention pulse width crystallization method.
Figure 4B:
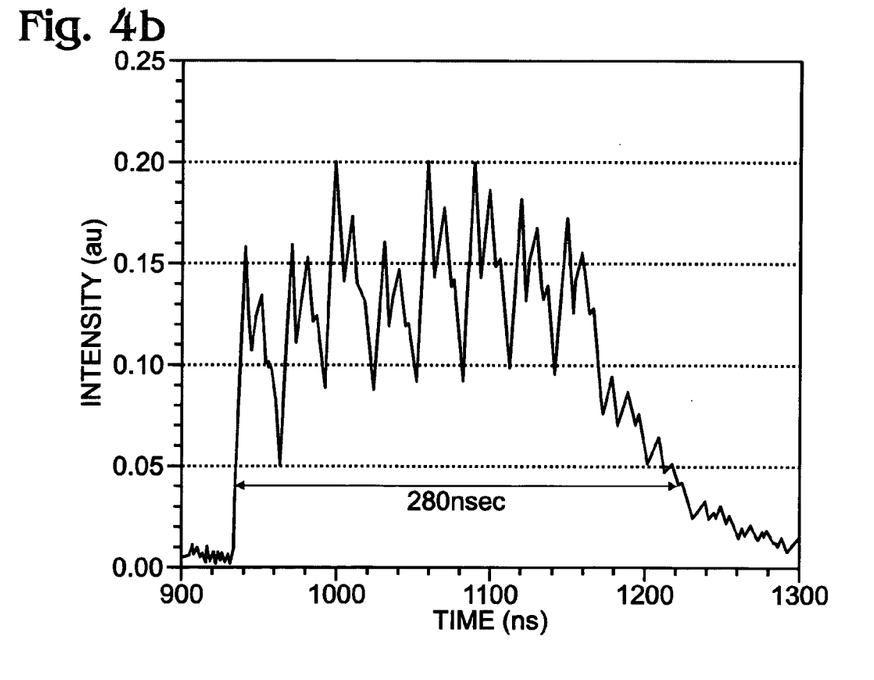

FIGS. 4a and 4b illustrate pulse width durations applicable to the present invention pulse width crystallization method. FIG. 4a depicts a pulse of duration of approximately 28 ns, as measured at FWHM). FIG. 4b depicts a pulse duration of approximately 280 ns, as measured at FWHM. Both pulse durations were produced from an XeCl (308 nm) excimer laser. A digital oscilloscope was used to capture the pulse duration, in each case.

Figure 5:
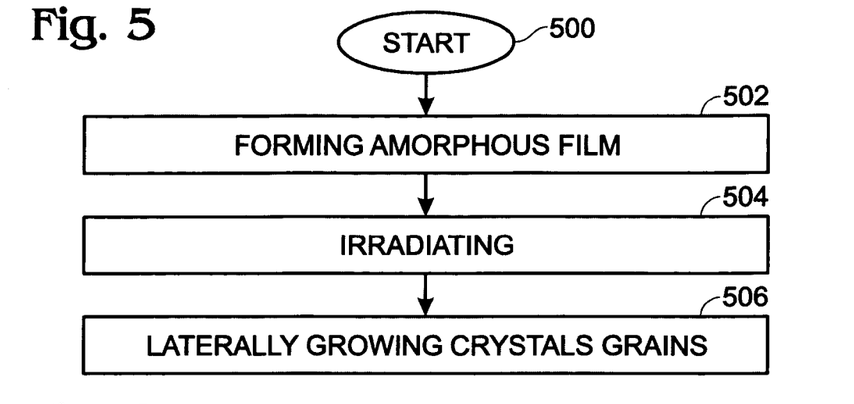
FIG. 5 is a flowchart illustrating the present invention method for crystallizing a silicon film in LCD fabrication.

FIG. 5 is a flowchart illustrating the present invention method for crystallizing a silicon film in LCD fabrication. Although the method, and the methods illustrated by FIGS. 6, 7, 8, and 9 below, is depicted as a sequence of numbered steps for clarity, no order should be inferred from the numbering unless explicitly stated. The method begins at Step 500. Step 502 forms an amorphous silicon film. Step 504 irradiates the silicon film with a laser pulse having a pulse width of (FWHM), and a beamlet width in the range of 3 to 20 microns. In some aspects, the beamlet width in Step 504 is in the range between 3–10 microns, or in the range between 3–5 microns. Step 506, in response to irradiating the silicon film, laterally grows crystal grains.

Irradiating the silicon film with a laser pulse having a pulse width of greater than 50 ns in Step 504 includes irradiating with a pulse having a pulse width in the range between greater than 50, and less than or equal to 300 ns FWHM. In other aspects, Step 504 includes irradiating the silicon film with a first energy density in the range from 200 to 1300 millijoules per square centimeter (mJ/cm$^2$), at a wavelength of 550 nanometers (nm) or less.

Forming an amorphous silicon film in Step 502 includes forming a film having a thickness in the range of 100 to 1000 Angstroms (Å). Preferably, the film has a thickness in the range of 100 to 500 Å. Laterally growing crystal grains in Step 506 includes forming crystal grains having a length in the range from 5 to 10 microns.

When Step 502 forms a film having a thickness in the range of 400 to 500 Å, then Step 504 irradiates with a pulse having a pulse width in the range between greater than 50, and less than or equal to 200 ns FWHM and a first energy density in the range from 400 to 1000 millijoules per square centimeter (mJ/cm$^2$).

When Step 502 forms a film having a thickness in the range of 300 to 400 Å, then Step 504 irradiates with a pulse having a pulse width in the range between greater than 50, and less than or equal to 120 ns FWHM and a first energy density in the range from 300 to 700 mJ/cm$^2$. Preferably, the pulse width is in the range between greater than 50, and less than or equal to 100 ns FWHM and the first energy density is in the range from 300 to 700 mJ/cm$^2$.

When Step 502 forms a film having a thickness in the range of 100 to 300 Å, then Step 504 irradiates with a pulse having a pulse width in the range between greater than 50 and less than or equal to 90 ns FWHM and a first energy density in the range from 250 to 500 mJ/cm$^2$. Preferably, the first energy density is in the range from 250 to 500 mJ/cm$^2$.

Figure 6:
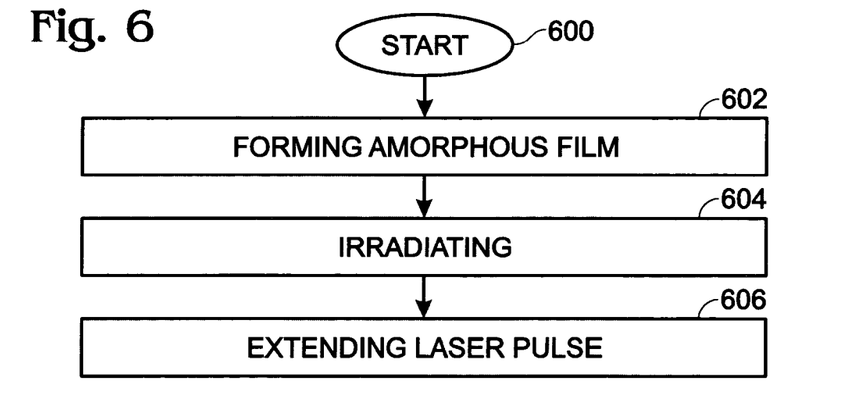
FIG. 6 is a flowchart illustrating an alternate method for crystallizing a silicon film in LCD fabrication.

FIG. 6 is a flowchart illustrating an alternate method for crystallizing a silicon film in LCD fabrication. The method starts at Step 600. Step 602 forms an amorphous silicon film. Step 604 irradiates the silicon film with a laser pulse having a first energy density sufficient to melt, but not evaporate the silicon film. Step 606 extends the laser pulse at the first energy density to prolong the melt duration of the silicon film. The phrase "extends the laser pulse" as used herein, means to continue applying a laser pulse past the duration of time needed to melt (but not evaporate) the film.

Extending the laser pulse at the first energy density to prolong the melt duration of the silicon film in Step 606 includes forming a pulse having a pulse width of greater than 50 nanoseconds (ns) or greater, as measured at full-width-half-maximum (FWHM), and a beamlet width in the range of 3 to 20 microns. In some aspects, the beamlet width is in the range of 3–10 microns. In other aspects, the width is in the range of 3–5 microns. Typically, the pulse width is in the range of greater than 50, and less than or equal to 300 ns FWHM.

Irradiating the silicon film with a laser pulse having a first energy density in Step 604 includes irradiating the silicon film with a first energy density in the range from 200 to 1300 mJ/cm$^2$, at a wavelength of 550 nanometers (nm) or less.

Forming an amorphous silicon film in Step 602 includes forming a film having a thickness in the range of 100 to 1000 Angstroms (Å). Preferably, the film has a thickness in the range of 100 to 500 Å.

Figure 7:
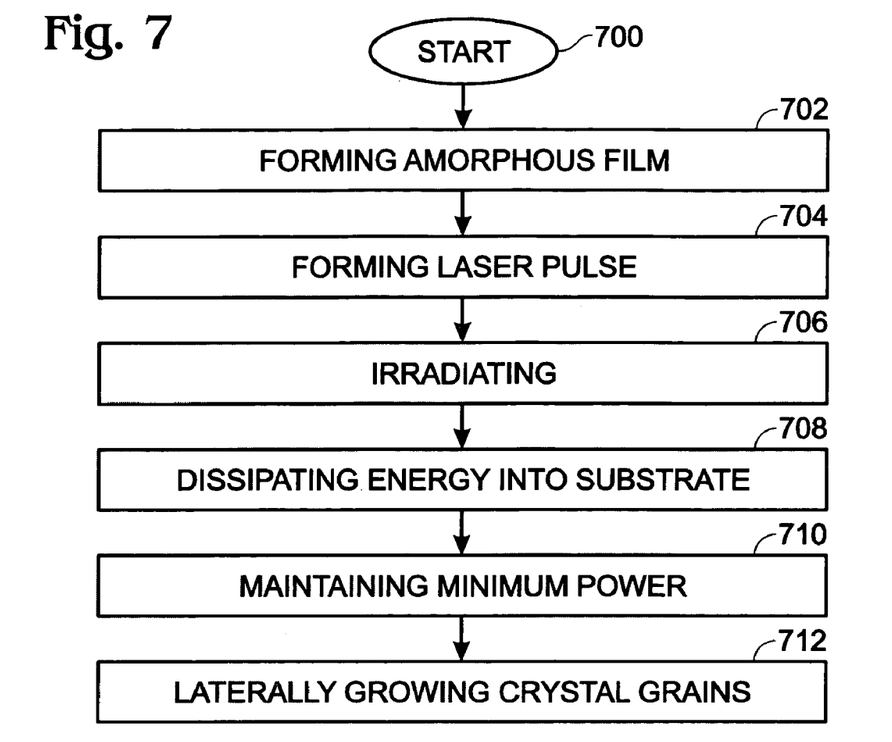
FIG. 7 is a flowchart illustrating another method for crystallizing a silicon film in LCD fabrication.

FIG. 7 is a flowchart illustrating another method for crystallizing a silicon film in LCD fabrication. The method begins at Step 700. Step 702 forms an amorphous silicon film overlying a substrate. Step 704 forms a laser pulse having a pulse width of 30 nanoseconds (ns) or greater, as measured at full-width-half-maximum (FWHM), and a beamlet width in the range of 3 to 20 microns. In some aspects, the beamlet width is in the range of 3–10 microns. In other aspects, the beamlet width is in the range of 3–5 microns. Step 706 irradiates the silicon film with a laser pulse having a first energy density. Step 708 dissipates energy from the silicon film into the substrate. Step 710 maintains a minimum power into the silicon film. Step 712 laterally grows crystal grains.

Irradiating the silicon film with a laser pulse having a first energy density in Step 706 includes forming a pulse width in the range of 30 to 300 ns FWHM, irradiating the silicon film with a first energy density in the range from 200 to 1300 millijoules per square centimeter (mJ/cm$^2$), at a wavelength of 550 nanometers (nm) or less.

Forming an amorphous silicon film in Step 702 includes forming a film having a thickness in the range of 100 to 1000 Angstroms (Å). Preferably, a film having a thickness in the range of 100 to 500 Å is formed.

Figure 8:
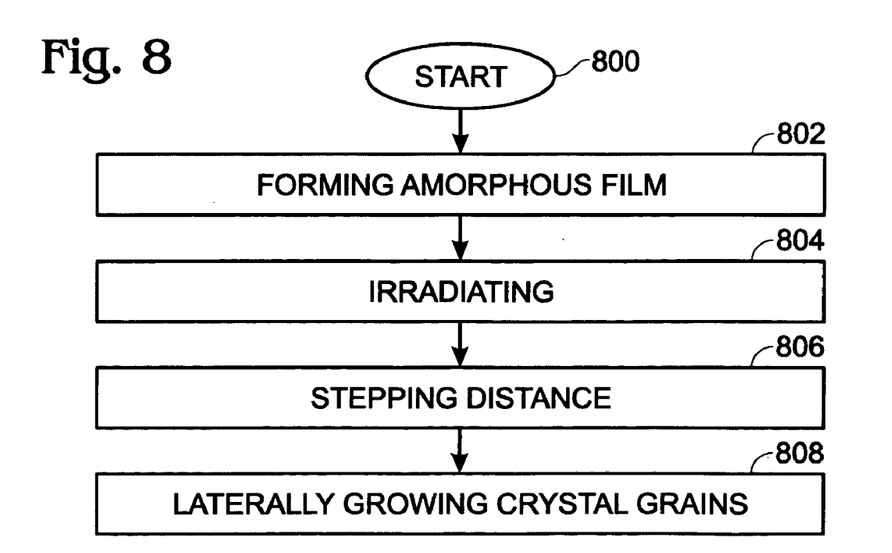
FIG. 8 is a flowchart illustrating a variation of the present invention method for crystallizing a silicon film.

FIG. 8 is a flowchart illustrating a variation of the present invention method for crystallizing a silicon film. The method starts at Step 800. Step 802 forms an amorphous silicon film. Step 804 irradiates the silicon film with a laser pulse having a pulse width of 30 nanoseconds (ns) or greater, as measured at the full-width-half-maximum (FWHM), and a beamlet width in the range of 3 to 20 microns. In some aspects, the beamlet width is in the range of 3–10 microns. In other aspects, the beamlet width is in the range of 3–5 microns. Step 806 steps a distance across the silicon film and repeats the irradiation. Step 808, in response, laterally grows crystal grains in the stepped direction, by a length that is more than half the stepped distance.

Figure 9:
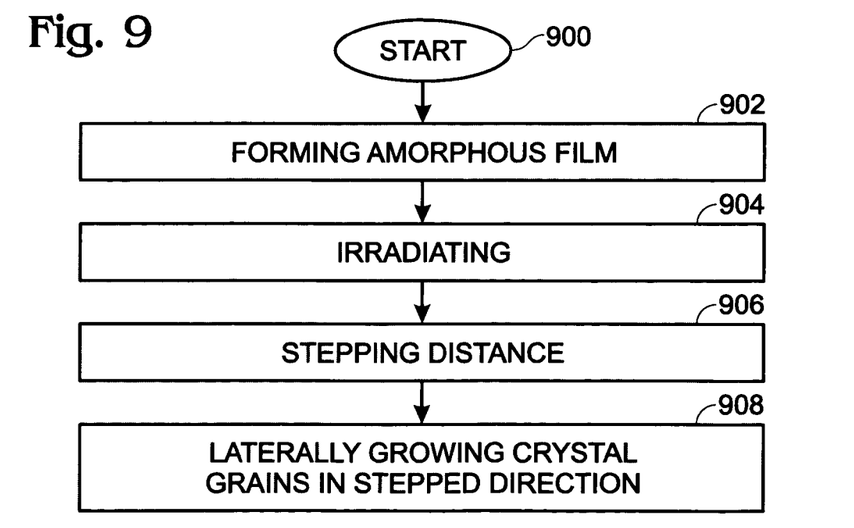
FIG. 9 is a flowchart illustrating yet another aspect of the present invention method for crystallizing a silicon film.

FIG. 9 is a flowchart illustrating yet another aspect of the present invention method for crystallizing a silicon film. The method starts at Step 900. Step 902 forms an amorphous silicon film. Step 904 irradiates the silicon film with a laser pulse having a pulse width of 30 nanoseconds (ns) or greater, as measured at the full-width-half-maximum (FWHM), and a beamlet width in the range of 3 to 20 microns. In some aspects, the beamlet width is in the range of 3–10 microns. In other aspects, the beamlet width is in the range of 3–5 microns. Step 906 steps a distance across the silicon film and repeats the irradiation. Step 908, in response, laterally grows crystal grains in the stepped direction.

In some aspects, irradiating the silicon film with a laser pulse having a pulse width of 30 ns or greater in Step 904 includes irradiating with a pulse having a pulse width in the range between 30 and 300 ns FWHM. In other aspects, irradiating the silicon film with a laser pulse having a pulse width of 30 ns or greater in Step 904 includes irradiating the silicon film with a first energy density in the range from 200 to 1300 millijoules per square centimeter (mJ/cm$^2$). In some aspects, Step 904 irradiates at a wavelength of 550 nanometers (nm) or less.

In some aspects, forming an amorphous silicon film in Step 902 includes forming a film having a thickness in the range of 100 to 1000 Angstroms (Å). Alternately, the film thickness is in the range of 100 to 500 Å.

In some aspects, laterally growing crystal grains in Step 908 includes forming crystal grains having a length in the range from 5 to 10 microns.

In other aspects, forming an amorphous silicon film in Step 902 includes forming a film having a thickness in the range of 400 to 500 Å. Then, irradiating the silicon film with a laser pulse having a pulse width of 30 ns or greater in Step 904 includes irradiating with a pulse having a pulse width in the range between 30 and 200 ns FWHM and a first energy density in the range from 400 to 1000 millijoules per square centimeter (mJ/cm$^2$).

In some aspects, forming an amorphous silicon film in Step 902 includes forming a film having a thickness in the range of 300 to 400 Å. Then, irradiating the silicon film with a laser pulse having a pulse width of 30 ns or greater in Step 904 includes irradiating with a pulse having a pulse width in the range between 30 and 120 ns FWHM and a first energy density in the range from 300 to 700 millijoules per square centimeter (mJ/cm$^2$).

In other aspects, forming an amorphous silicon film in Step 902 includes forming a film having a thickness in the range of 300 to 400 Å. Then, irradiating the silicon film with a laser pulse in Step 904 includes irradiating with a pulse having a pulse width in the range between 30 and 100 ns FWHM and a first energy density in the range from 300 to 700 millijoules per square centimeter (mJ/cm$^2$).

In some aspects, Step 902 forms a film having a thickness in the range of 100 to 300 Å and Step 904 irradiating with a pulse having a pulse width in the range between 30 and 90 ns FWHM and a first energy density in the range from 250 to 500 millijoules per square centimeter (mJ/cm$^2$).

In other aspects, Step 902 forms a film having a thickness in the range of 100 to 300 Å and Step 904 irradiates with a pulse having a pulse width in the range between 30 and 90 ns FWHM and a first energy density in the range from 250 to 500 millijoules per square centimeter (mJ/cm$^2$).

A method has been provided to extend the lateral growth of crystals in a silicon film by prolonging the duration of the laser pulses. Examples have been provided for specific film thicknesses. However, other variations and embodiments of the invention will occur to those skilled in the art. Although the present invention methods were specifically developed for relatively low temperature LCD fabrication processes, the methods are also applicable to more general integrated circuit fabrication processes.

I claim:

1. In liquid crystal display (LCD) fabrication, a method for crystallizing a silicon film, the method comprising:
    forming an amorphous silicon film;
    irradiating the silicon film with a laser pulse having a pulse width of greater than 50 nanoseconds (ns), as measured at the full-width-half-maximum (FWHM), and a beamlet width in the range of 3 to 20 microns; and,
    in response to irradiating the silicon film, laterally growing crystal grains.

2. The method of claim 1 wherein irradiating the silicon film with a laser pulse having a pulse width of greater than 50 ns includes irradiating with a pulse having a pulse width in the range between greater than 50 ns, and less than or equal to 300 ns FWHM.

3. The method of claim 1 wherein irradiating the silicon film with a laser pulse having a pulse width of greater than 50 ns includes irradiating the silicon film with a first energy density in the range from 200 to 1300 millijoules per square centimeter (mJ/cm$^2$).

4. The method of claim 1 wherein irradiating the silicon film with a laser pulse having a pulse width of greater than 50 ns includes irradiating at a wavelength of 550 nanometers (nm) or less.

5. The method of claim 1 wherein forming an amorphous silicon film includes forming a film having a thickness in the range of 100 to 1000 Angstroms (Å).

6. The method of claim 1 wherein forming an amorphous silicon film includes forming a film having a thickness in the range of 100 to 500 Å.

7. The method of claim 1 wherein laterally growing crystal grains includes forming crystal grains having a length in the range from 5 to 10 microns.

8. The method of claim 1 wherein forming an amorphous silicon film includes forming a film having a thickness in the range of 400 to 500 Å; and,
    wherein irradiating the silicon film with a laser pulse having a pulse width of greater than 50 ns includes irradiating with a pulse having a pulse width in the range between greater than 50 ns, and less than or equal to 200 ns FWHM and a first energy density in the range from 400 to 1000 millijoules per square centimeter (mJ/cm$^2$).

9. The method of claim 1 wherein forming an amorphous silicon film includes forming a film having a thickness in the range of 300 to 400 Å; and,
    wherein irradiating the silicon film with a laser pulse having a pulse width of greater than 50 ns includes irradiating with a pulse having a pulse width in the range between greater than 50 ns, and less than or equal to 120 ns FWHM and a first energy density in the range from 300 to 700 millijoules per square centimeter (mJ/cm$^2$).

10. The method of claim 1 wherein forming an amorphous silicon film includes forming a film having a thickness in the range of 300 to 400 Å; and,
    wherein irradiating the silicon film with a laser pulse having a pulse width of greater than 50 ns includes irradiating with a pulse having a pulse width in the range between greater than 50 ns, and less than or equal to 100 ns FWHM and a first energy density in the range from 300 to 700 millijoules per square centimeter (mJ/cm$^{2}$).

11. The method of claim 1 wherein forming an amorphous silicon film includes forming a film having a thickness in the range of 100 to 300 Å; and,
wherein irradiating the silicon film with a laser pulse having a pulse width of greater than 50 ns includes irradiating with a pulse having a pulse width in the range between greater than 50 ns, and less than or equal to 90 ns FWHM and a first energy density in the range from 250 to 500 millijoules per square centimeter (mJ/cm$^{2}$).

12. The method of claim 1 wherein forming an amorphous silicon film includes forming a film having a thickness in the range of 100 to 300 Å; and,
wherein irradiating the silicon film with a laser pulse having a pulse width of greater than 50 ns includes irradiating with a pulse having a pulse width in the range between greater than 50 ns, and less than or equal to 90 ns FWHM and a first energy density in the range from 250 to 500 millijoules per square centimeter (mJ/cm$^{2}$).

13. The method of claim 1 wherein irradiating the silicon film with a laser pulse having a pulse width of greater than 50 nanoseconds (ns), as measured at the full-width-half-maximum (FWHM), and a beamlet width in the range of 3 to 20 microns includes irradiating with a beamlet width range selected from the group including 3–10 microns and 3–5 microns.

14. A method for crystallizing a silicon film, the method comprising:
forming an amorphous silicon film;
irradiating the silicon film with a laser pulse having a pulse width of 30 nanoseconds (ns) or greater, as measured at the full-width-half-maximum (FWHM), and a beamlet width in the range of 3 to 20 microns;
stepping a distance across the silicon film and repeating the irradiation; and,
in response, laterally growing crystal grains in the stepped direction, by a length that is more than half the stepped distance.

15. The method of claim 14 wherein irradiating the silicon film with a laser pulse having a pulse width of 30 nanoseconds (ns) or greater, as measured at the full-width-half-maximum (FWHM), and a beamlet width in the range of 3 to 20 microns includes irradiating with a beamlet width range selected from the group including 3–10 microns and 3–5 microns.

16. In liquid crystal display (LCD) fabrication, a method for crystallizing a silicon film, the method comprising:
forming an amorphous silicon film;
irradiating the silicon film with a laser pulse having a first energy density sufficient to melt, but not evaporate the silicon film;
extending the laser pulse at the first energy density to prolong the melt duration of the silicon film; and,
wherein extending the laser pulse at the first energy density to prolong the melt duration of the silicon film includes forming a pulse having a pulse width of greater than 50 nanoseconds (ns), as measured at full-width-half-maximum (FWHM), and a beamlet width in the range of 3 to 20 microns.

17. The method of claim 16 wherein extending the laser pulse at the first energy density to prolong the melt duration of the silicon film includes forming a pulse having a pulse width in the range between greater than 50 ns, and less than or equal to 300 ns FWHM.

18. The method of claim 16 wherein irradiating the silicon film with a laser pulse having a first energy density includes irradiating the silicon film with a first energy density in the range from 200 to 1300 millijoules per square centimeter (mJ/cm$^{2}$).

19. The method of claim 16 wherein irradiating the silicon film with a laser pulse includes irradiating at a wavelength of 550 nanometers (nm) or less.

20. The method of claim 16 wherein forming an amorphous silicon film includes forming a film having a thickness in the range of 100 to 1000 Angstroms (Å).

21. The method of claim 16 wherein forming an amorphous silicon film includes forming a film having a thickness in the range of 100 to 500 Å.

22. The method of claim 16 wherein extending the laser pulse at the first energy density to prolong the melt duration of the silicon film includes forming a pulse having a pulse width of greater than 50 nanoseconds (ns), as measured at full-width-half-maximum (FWHM), and a beamlet width in the range of 3 to 20 microns includes forming a beamlet width having a range selected from the group including 3–10 microns and 3–5 microns.

23. In liquid crystal display (LCD) fabrication, a method for crystallizing a silicon film, the method comprising:
forming an amorphous silicon film overlying a substrate;
forming a laser pulse having a pulse width of 30 nanoseconds (ns) or greater, as measured at full-width-half-maximum (FWHM), and a beamlet width in the range of 3 to 20 microns;
irradiating the silicon film with a laser pulse having a first energy density;
dissipating energy from the silicon film into the substrate;
maintaining a minimum power into the silicon film; and,
laterally growing crystal grains.

24. The method of claim 23 wherein irradiating the silicon film with a laser pulse having a first energy density includes forming a laser pulse having a pulse width in the range of 30 to 300 ns FWHM.

25. The method of claim 23 wherein irradiating the silicon film with a laser pulse having a first energy density includes irradiating the silicon film with a first energy density in the range from 200 to 1300 millijoules per square centimeter (mJ/cm$^{2}$).

26. The method of claim 23 wherein irradiating the silicon film with a laser pulse includes irradiating at a wavelength of 550 nanometers (nm) or less.

27. The method of claim 23 wherein forming an amorphous silicon film includes forming a film having a thickness in the range of 100 to 1000 Angstroms (Å).

28. The method of claim 23 wherein forming an amorphous silicon film includes forming a film having a thickness in the range of 100 to 500 Å.

29. The method of claim 23 wherein forming a laser pulse having a pulse width of 30 nanoseconds (ns) or greater, as measured at full-width-half-maximum (FWHM), and a beamlet width in the range of 3 to 20 microns includes forming a beamlet width having a range selected from the group including 3–10 microns and 3–5 microns.

30. A method for crystallizing a silicon film, the method comprising:
forming an amorphous silicon film;
irradiating the silicon film with a laser pulse having a pulse width of 30 nanoseconds (ns) or greater, as measured at the full-width-half-maximum (FWHM), and a beamlet width in the range of 3 to 20 microns;

stepping a distance across the silicon film and repeating the irradiation; and, in response, laterally growing crystal grains in the stepped direction.

31. The method of claim 30 wherein irradiating the silicon film with a laser pulse having a pulse width of 30 ns or greater includes irradiating with a pulse having a pulse width in the range between 30 and 300 ns FWHM.

32. The method of claim 30 wherein irradiating the silicon film with a laser pulse having a pulse width of 30 ns or greater includes irradiating the silicon film with a first energy density in the range from 200 to 1300 millijoules per square centimeter (mJ/cm$^2$).

33. The method of claim 30 wherein irradiating the silicon film with a laser pulse having a pulse width of 30 ns or greater includes irradiating at a wavelength of 550 nanometers (nm) or less.

34. The method of claim 30 wherein forming an amorphous silicon film includes forming a film having a thickness in the range of 100 to 1000 Angstroms (Å).

35. The method of claim 30 wherein forming an amorphous silicon film includes forming a film having a thickness in the range of 100 to 500 Å.

36. The method of claim 30 wherein laterally growing crystal grains includes forming crystal grains having a length in the range from 5 to 10 microns.

37. The method of claim 30 wherein forming an amorphous silicon film includes forming a film having a thickness in the range of 400 to 500 Å; and, wherein irradiating the silicon film with a laser pulse having a pulse width of 30 ns or greater includes irradiating with a pulse having a pulse width in the range between 30 and 200 ns FWHM and a first energy density in the range from 400 to 1000 millijoules per square centimeter (mJ/cm$^2$).

38. The method of claim 30 wherein forming an amorphous silicon film includes forming a film having a thickness in the range of 300 to 400 Å; and, wherein irradiating the silicon film with a laser pulse having a pulse width of 30 ns or greater includes irradiating with a pulse having a pulse width in the range between 30 and 120 ns FWHM and a first energy density in the range from 300 to 700 millijoules per square centimeter (mJ/cm$^2$).

39. The method of claim 30 wherein forming an amorphous silicon film includes forming a film having a thickness in the range of 300 to 400 Å; and, wherein irradiating the silicon film with a laser pulse having a pulse width of 30 ns or greater includes irradiating with a pulse having a pulse width in the range between 30 and 100 ns FWHM and a first energy density in the range from 300 to 700 millijoules per square centimeter (mJ/cm$^2$).

40. The method of claim 30 wherein forming an amorphous silicon film includes forming a film having a thickness in the range of 100 to 300 Å; and, wherein irradiating the silicon film with a laser pulse having a pulse width of 30 ns or greater includes irradiating with a pulse having a pulse width in the range between 30 and 90 ns FWHM and a first energy density in the range from 250 to 500 millijoules per square centimeter (mJ/cm$^2$).

41. The method of claim 30 wherein forming an amorphous silicon film includes forming a film having a thickness in the range of 100 to 300 Å; and, wherein irradiating the silicon film with a laser pulse having a pulse width of 30 ns or greater includes irradiating with a pulse having a pulse width in the range between 30 and 90 ns FWHM and a first energy density in the range from 250 to 500 millijoules per square centimeter (mJ/cm$^2$).

42. The method of claim 30 wherein irradiating the silicon film with a laser pulse having a pulse width of 30 nanoseconds (ns) or greater, as measured at the full-width-half-maximum (FWHM), and a beamlet width in the range of 3 to 20 microns includes irradiating with a beamlet width range selected from the group including 3–10 microns and 3–5 microns.

* * * * *